United States Patent [19]

Bloss et al.

[11] 4,367,366

[45] Jan. 4, 1983

[54] SOLAR CELL ARRANGEMENT

[75] Inventors: Werner H. Bloss, Lindenstrasse 45, D-7065 Winterbach, Fed. Rep. of Germany; Gert H. Hewig, Steinenbronn, Fed. Rep. of Germany; Gerhard Laub; Erich Reinhardt, both of Stuttgart, Fed. Rep. of Germany

[73] Assignee: Werner H. Bloss, Winterbach, Fed. Rep. of Germany

[21] Appl. No.: 234,626

[22] Filed: Feb. 17, 1981

[30] Foreign Application Priority Data

Feb. 15, 1980 [DE] Fed. Rep. of Germany ....... 3005914

[51] Int. Cl.³ .............................................. H01L 31/04
[52] U.S. Cl. ..................................... 136/246; 136/259
[58] Field of Search ................................ 136/246, 259

[56] References Cited

U.S. PATENT DOCUMENTS

| | | | |
|---|---|---|---|
| 4,021,267 | 5/1977 | Dettling | 136/246 |
| 4,053,327 | 10/1977 | Meulenberg, Jr. | 136/256 |
| 4,174,978 | 11/1979 | Lidorenko et al. | 136/246 |
| 4,204,881 | 5/1980 | McGrew | 136/246 |

*Primary Examiner*—Aaron Weisstuch
*Attorney, Agent, or Firm*—Paul M. Craig, Jr.

[57] ABSTRACT

A solar cell arrangement with an associated optical collecting lens system. The lens system focuses a light impingement area onto the solar cell to intensify incident radiation. The collecting lens system includes an optically active layer provided between the light impingement area and the solar cells. The optically active layer images and disperses the incident light in a manner adapted to the surface and light absorption characteristics of the solar cells.

17 Claims, 6 Drawing Figures

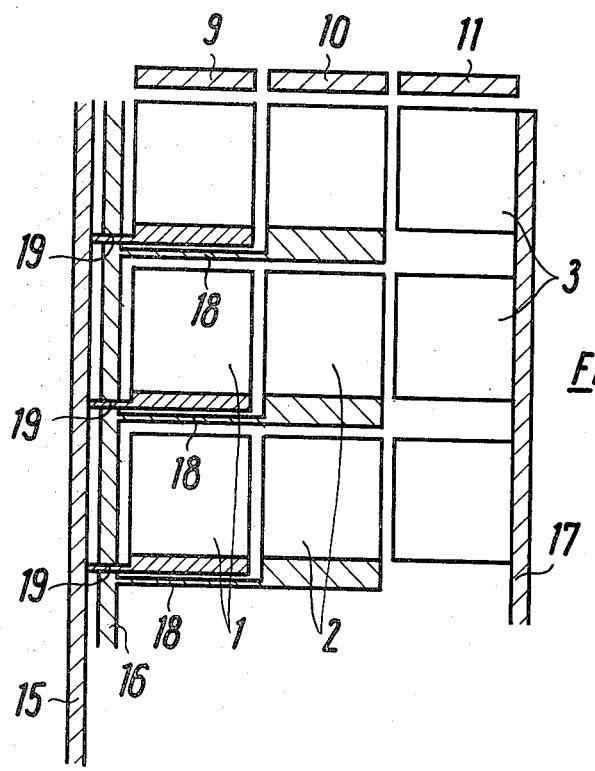
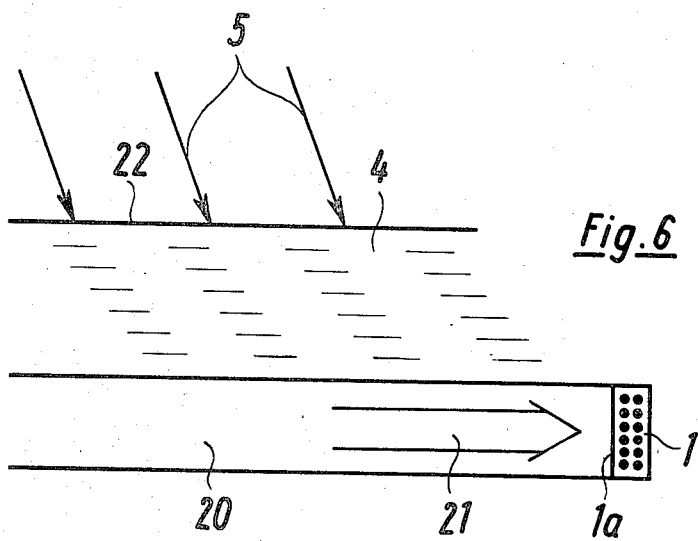

SOLAR CELL ARRANGEMENT

The present invention relates to a solar arrangement and, more particularly, to a solar cell arrangement with an associated optical collecting lens system, which system focuses a light impingement area image onto the solar cell to intensify incident radiation.

A number of solar cell arrangements of the aforementioned type have been proposed; however, a disadvantage of the proposed arrangements resides in the fact that a portion of the imaged light rays impinges on the necessarily provided contact surfaces of the solar cell which are generally constructed in the manner of grids. Therefore, the proportion of solar energy which strikes the contact grids cannot be converted into electrical current and, consequently, the degree of efficiency of such solar cell arrangements is initially limited to a certain extent in constructional respects.

As is known, the absorptivity of solar cells, depending upon the characteristics thereof, is substantially higher for certain spectral regions of incident light than for other spectral regions. In order to exploit the entire band width of incident solar radiation, it is advantageous and suitable to provide differing solar cells or solar cell groups which, due to their varying characteristics, respectively exhibit the maximum of their absorptivity in the various spectral regions of the radiation. In order to exploit the entire band width of indicent solar radiation, it has theoretically been proposed to arrange several solar cells or solar cell groups in superimposed layers, with each layer absorbing specific spectral regions of the radiation in accordance with the band gap of the material employed. A disadvantage of such arrangement resides in the fact that transitions between the layers must be effected either through contact layers or through contact grids which, in turn, have an absorbing effect and thus lead to losses in the overall total system. If the solar cells layers are connected in series, the current density is limited by the layer generating the lowest current. Moreover, since the spectrum of incident light can change, the current densities of the individual layers can also change so that, in total, there occurs a further impairment of the current yield.

Additionally, solar cell arrangements have been proposed with dichroic mirrors and with individually arranged solar cells wherein the individual spectral regions of the light are, in part, reflected or transmitted so that the solar cells may be correlated with specific spectral regions. A disadvantage of these proposed arrangements resides in the fact that the optical systems required are of a very complicated construction and also the mechanical parts which must be utilized are expensive since the focusing system must trail along with the sunlight to attain the maximum degree of efficiency.

The aim underlying the present invention essentially resides in providing a solar cell arrangement of the aforementioned type which is capable of attaining a higher degree of efficiency without excessive expenditure and yet in a relatively simple manner.

In accordance with advantageous features of the present invention, a solar cell arrangement with an associated optical collecting lens system is provided, with the lens system being adapted to focus a light impingement area image onto the solar cell so as to intensify incident radiation. The collecting lens system includes an optically active layer provided between the light impingement area and the solar cell, with the layer imaging the incident light in a way adapted to the surface and to the absorption characteristics of the solar cell.

By virtue of the above-noted constructional features of the present invention, the entire amount of incident light may be imaged so that the contact grid surfaces are excluded and, therefore, the proportion of converted solar energy is greater.

By the arrangement of several solar cells in accordance with the present invention, an advantageous solution is attained with the solar cells being arranged side-by-side and with the optically active layer being arranged at a spacing thereto, which layer acts, in this case, in a dispersive and focusing manner and transmits to each solar cell the correctly correlated spectral image. Such an arrangement has the advantage that the aforementioned deficiencies of the layered arrangement of solar cells are avoided and an expensive mirror system become superfluous.

The optically active layer of the solar cell arrangement of the present invention may be realized in both of the above noted cases in an especially simple manner by providing a gelatinous layer previously sensitized, in a conventional manner, so that if the layer is treated by incident light in the way of a hologram, the desired optical system is produced by phase modulation.

In an extremely simple manner, the solar cells may, in accordance with the present invention, be arranged in a plane and a gelatinous layer may likewise be made as a planar layer so that the flat area structure is formed which occupies little space and can be exposed to solar radiation without great expenditure.

Advantageously, in accordance with further features of the present invention, the gelatinous layer may be encapsulated between glass layers or the like, with a glass layer or layer of transparent material being provided to produce the spacing between the gelatinous layer and the solar cells. An advantage of these constructional features of the present invention resides in the fact that the interstices between the solar cell groups may be utilized for arranging the contacts and bus bars so that the finished flat construction may be presented in a form ready for connection.

It is also possible in accordance with the present invention not to place the gelatinous layer and solar cells in mutually parallel planes but rather to associate with the gelatinous layer and with each solar cell a lightguide, with the solar cell being arranged at the end of the lightguide. Additionally, in such an installation, the optically active gelatinous layer takes over the tasks of dispersing the incident light on the various lightguides in spectral regions as well as collecting each spectral region in the lightguide.

An advantage of the last-mentioned arrangement of the present invention resides in the fact that the solar cells may be placed essentially in a series side-by-side relationship or in a superimposed relationship in parallel to the light impingement area but arranged with their light impingement area at an angle, preferably, at a right angle, to the light impingement area.

In accordance with still further advantageous features of the present invention, the gelatinous layer is constructed so that the illumination intensities are applied differently to the individual solar cell surfaces, namely, so that the illumination intensity becomes smaller with increasing distance from the contacts. As can readily be appreciated, in this arrangement, the gelatinous layer may also advantageously be fashioned so that the provided contact grids or bus bars are excluded from illumination, whereby these zones do not absorb light and thus the degree of efficiency of the total arrangement becomes greater.

In accordance with further features of the present invention, the hologram is constructed so that the incident solar radiation, independently of the time of day, exits from the gelatinous layer always in the same direction, thereby achieving the advantage that the solar cell arrangement need not be guided along mechanically in correspondence with the position of the sun.

In accordance with the present invention, at least two solar cells may be connected to each other in parallel, with each of the solar cells having differing absorptivity. The cells are exposed, through the aid of optical means, respectively to the impingement of associated spectral regions of the incident solar radiation.

The solar cells of the present invention may be located in a row with their light impingement areas, as noted above, being disposed at an angle to the light impingement area of the gelatinous layer.

As can readily be appreciated from the following description, additional advantages are attained by the present invention especially with respect to the arrangement of the contacts in the solar cell.

Accordingly, it is an object of the present invention to provide a solar cell arrangement which avoids, by simple means, shortcomings and disadvantages encountered in the prior art.

Another object of the present invention resides in providing a solar cell arrangement which does not require the use of a complicated optical system.

A still further object of the present invention resides in providing a solar cell arrangement which enables an exploitation of an entire band width of the incident solar radiation.

A still further object of the present invention resides in providing a solar cell arrangement which is simple in construction and therefore relatively inexpensive to manufacture.

Yet another object of the present invention resides in providing a solar cell arrangement which enables an increase in the proportion of converted solar energy.

These and other objects, features, and advantages of the present invention will become more apparent from the following description when taken in connection with the accompanying drawings which show, for the purposes of illustration only, several embodiments in accordance with the present invention, and wherein.

Figure 3:
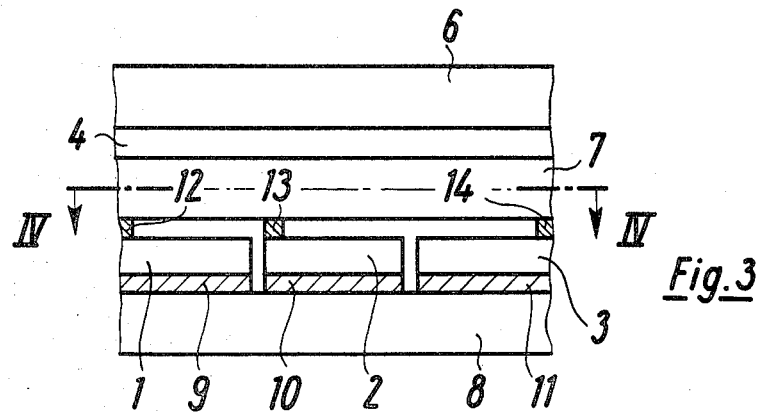
FIG. 3 is a schematic partial cross sectional view through a flat area solar cell structure of the present invention which may have the shape of a panel or a mat.
Figure 4:
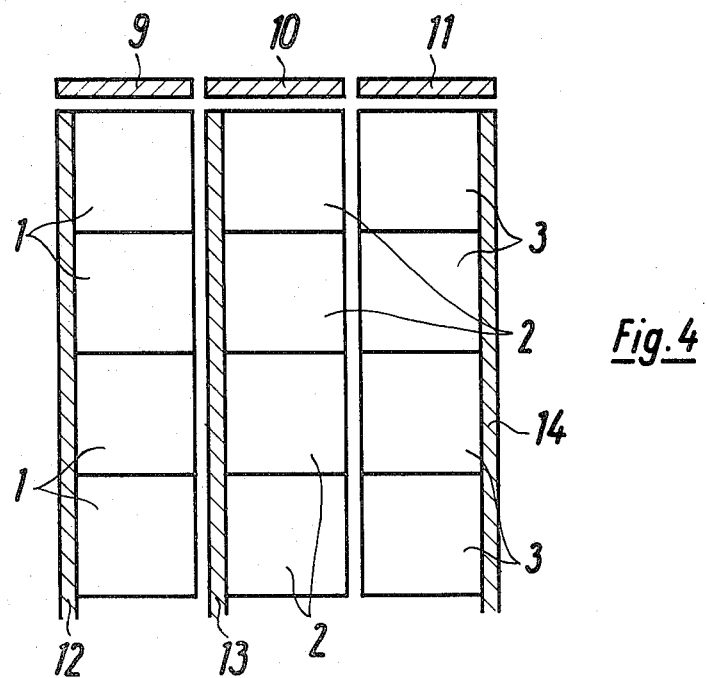
FIG. 4 is a cross sectional view taken along the line IV—IV in FIG. 3.

FIG. 5 is a cross sectional view similar to FIG. 4 of a further embodiment of a contact system for a solar cell arrangement in accordance with the present invention; and FIG. 6 is a schematic sectional view similar to FIG. 3 through a solar cell arrangement in accordance with the present invention wherein the solar cells are arranged with light impingement areas at an angle to a light impingement area of an optically active layer, with lightguides for the light being employed.

Figure 1:
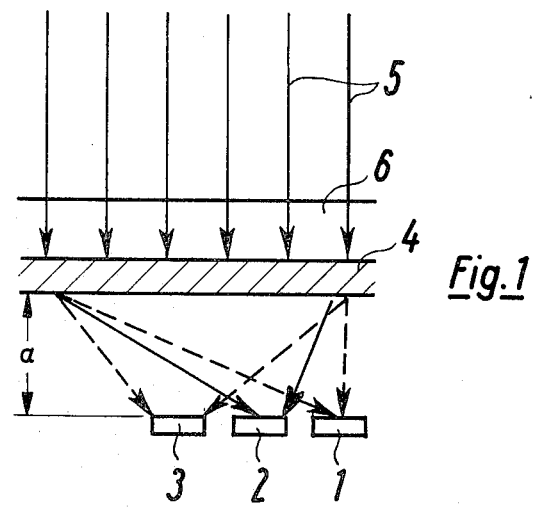
FIG. 1 is a schematic or cross sectional view of a basic structure of the solar cell arrangement in accordance with the present invention.

Referring now to the drawings, wherein like reference numerals are used throughout the various views to designate like parts and, more particularly, to FIGS. 1 and 3, according to these Figures, solar cells 1, 2, or 3 are arranged at a spacing a from an optically active layer 4. Incident light rays 5 such as, for example, solar radiation, impinge upon a surface of the optically active layer 4. A transparent layer 6 of, for example, glass or other transparent material, is placed forwardly or in front of the optically active layer 4.

Figure 2:
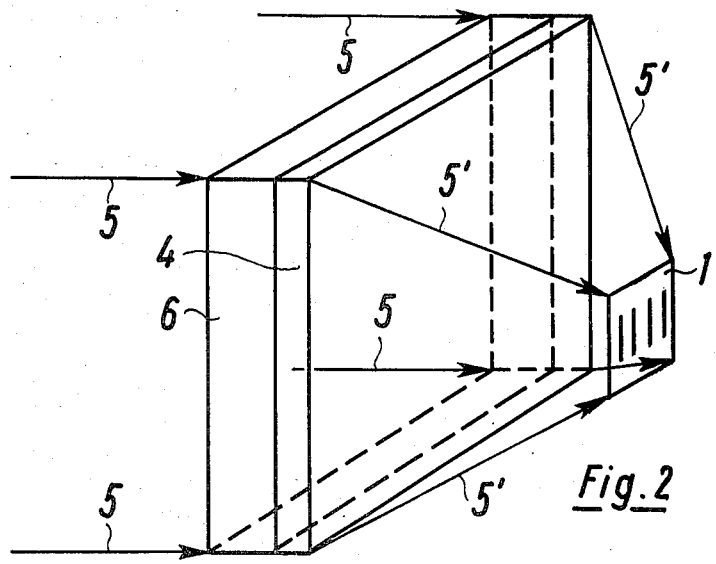
FIG. 2 is a perspective view of a portion of the solar cell arrangement of the present invention with only one solar cell and associated optical system being illustrated.

As shown most clearly in FIG. 2, the optically active layer 4 is constructed so that it focuses, on the one hand, on the rays 5 of the incident light, that is, transforms the rays 5 into converging rays 5' which then impinge on the surface of the solar cell 1 or another cell. The optically active layer 4 may, for example, be constituted suitably of a gelatinous layer treated in the manner of a hologram (e.g., a volume phase hologram), which may exhibit the optical characteristics of a collecting lens, that is, which exhibits focusing properties such as illustrated in FIG. 2.

As shown in FIG. 1, several solar cells 1, 2, 3, etc. may be arranged in a side-by-side relationship for the novel solar cell installation of the present invention and, in the illustrated embodiment, the several solar cells 1, 2, 3 are positioned in one plane with the optically active layer 4 having a dispersive effect in such a manner that each of the solar cells 1, 2, 3 is correlated with a specific spectral region of the incident light rays 5.

The dispersive properties can likewise be realized in the gelatinous layer forming the optically active layer 4 so as to achieve the effect that, for example, the solar cell 1 is correlated with the blue image of a sun and the solar cell 3 is correlated with the red image of a sun, with the interposed solar cell 2 being correlated to the spectral regions lying between red and blue. Thus, by virtue of the arrangement of the present invention, each of the illustrated three solar cells 1, 2, 3 receives a certain predetermined spectral region of the incident layer rays 5 focused upon its surface. Therefore, the solar cells 1, 2, and/or 3 can be adapted to the specific spectral region by making them of a material having a corresponding band gap and, in this manner, as noted above, the degree of efficiency of the individual solar cells may be improved.

As shown in FIG. 3, the entire solar cell arrangement may be fashioned as a flat structure and the spacing a may be constituted by a transparent layer 7 of, for example, glass, or of a transparent synthetic resin, and if the solar cells 1, 2, and 3, including the gelatinous layer forming the optically active layer 4 form a sandwich structure. The bottom of the flat structure, which may be of a mat or panel form, is also constituted by a transparent layer 8 which may consist of the same material as the layers 6, 7.

The problem of contacting the individual solar cells 1, 2, and 3 can be solved in a relatively simple manner shown in FIGS. 3 and 4. More particularly, according to these figures, rear contacts 9, 10, and 11 are each extended toward one side and may be tapped at the rim of the solar cell arrangement, while the forward contacts are fashioned as bus bars 12, 13, 14, each of which respectively extends over a series of solar cells 1, 2, 3 made of the same material. As shown in FIG. 4, the bus bars 12, 13, 14 may be tapped at the other end of the total solar cell arrangement. The rear contacts 9, 10, 11 and forward contacts formed as bus bars 12, 13, 14 respectively, are in each case countersunk into the substrate of the sandwich comprising transparent layers 6, 7 and/or 8, as shown most clearly in FIG. 3. In this manner, as shown in FIG. 4, respectively continuous and mutually parallel rows of solar cells 1, 2, and 3 are produced with respectively identical absorption characteristics, to which the impinging light rays 5 are transmitted in the manner shown in FIG. 1. If, for example, a cylindrical lens is realized in the gelatinous layer forming the optically active layer 4, then the imaging can be choosen to be such that no light proportions impinge on the contact surfaces.

FIG. 5 provides another example of a contact arrangement for solar cells 1, 2, and/or 3, which solar cells are arranged in mutually parallel rows. As shown in FIG. 5, the rear contacts 9, 10 and 11 are constructed in the same manner as that illustrated in FIGS. 3 and 4; however, front side contacts 15, 16, and 17 are each extended to an outside edge of the strips of solar elements 1, 2, and 3. In this arrangement, the solar cells of strips are respectively connected to the front contacts 17, whereas, the solar cells of strip 2, through the interposition of contact bridges 18, contact front contact 16, with the solar cells of strip 1 being connected to front contact 15 through contact bridges 19 which, in an insulating fashion, extend over contact rail 16.

FIG. 6 provides an example of a solar arrangement having the basic structure which is the same as the arrangement of FIG. 1 with respect to the provision of a gelatinous layer forming the optically active layer 4 having focusing and dispersive effects and distributing the incident light rays 5 into various spectral regions onto laterally juxtaposed rows. The only difference between the construction of FIG. 6 and that of FIG. 1 resides in the fact that the gelatinous material is located directly on juxtaposed lightguides 20 which may be formed in a layer lying beneath the gelatinous layer and which receive proportions of the incident light from the gelatinous layer forming the optically active layer 4, which are correlated with the individual spectral regions and transmit these proportions in the directions of the arrow 21 to the correspondingly fashioned solar cells 1 and/or 2, and/or 3, arranged at the end of the lightguide 20.

It is also possible in accordance with the present invention to arrange light guide surfaces, for example, in the form of glass plates, one below the other instead of in a side-by-side relationship, wherein each lightguide surface is associated with a gelatinous layer which, in this case, filters out the corresponding light spectrum and couples the same into the lightguide surface. The other spectral regions penetrate the individual layers almost without attentuation. In either case, the solar cells 1, 2 and 3 are oriented with respect to their light impingement area 1a so that they are not in parallel to the incidence area 22 of the gelatinous layer forming the optically active layer 4, as in FIGS. 1–5, but rather so that they are oriented with the area 1a at an angle of, preferably, 90° thereto. Additionally, in these constructions, the gelatinous layer forming the optically active layer 4 and the lightguides or lightguide surfaces 20 may be accommodated in a transparent substrate so that here also plate, foil, or film-like strips may be obtained for the solar cell arrangement, which subsequently provide for a very easy installation at desired locations exposed to solar radiation.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

We claim:

1. A solar arrangement which includes at least one solar cell and an optical collecting lens means associated therewith for focusing a light impingement area image onto the solar cell to intensify incident radiation, characterized in that the collecting lens means includes an optically active layer provided between the light impingement area and the at least one solar cell, said optically active layer being of a layer of gelatinous material treated by incident light in the manner of forming a hologram, said optically active layer imaging the incident light such that the light is focused on the at least one solar cell surface so as to intensify incident radiation and the light transmitted to the at least one solar cell is tailored to the light absorption characteristics of the at least one solar cell.

2. A solar arrangement according to claim 1, characterized in that at least two solar cells are provided and connected to each other in parallel, each of the solar cells have differing light absorption characteristics, the solar cells are arranged in a side by side relationship, optical means are provided for exposing the respective cells to an impingement of an associated spectral range of the incident solar radiation, and in that the optically active layer is spaced from the solar cells, and said optically active layer is adapted to have a dispersive and focusing effect and to transmit an associated spectro image to the respective solar cells.

3. A solar arrangement according to claim 2, characterized in that the solar cells are arranged in a single plane, and in that the optically active layer is of a planar construction.

4. A solar arrangement according to claim 3, characterized in that a transparent cover layer is provided for protecting the layer of gelatinous material, and the layer of gelatinous material is disposed beneath the transparent cover layer.

5. A solar arrangement according to one of claims 2, 3, or 4, characterized in that means are provided for spacing the layer of gelatinous material from the solar cells.

6. A solar arrangement according to claim 6, characterized in that said spacing means is a layer of transparent material.

7. A solar arrangement according to claim 6 characterized in that the optically active layer is sandwiched between layers of transparent material.

8. A solar arrangement according to claim 6, characterized in that the solar cells are arranged in spaced solar cell groups, and in that at least one of contact means and bus bar means are disposed in spaces between the solar cell groups.

9. A solar arrangement according to claim 8, characterized in that at least one of said contact means and bus bar means are countersunk into transparent layers adjacent the solar cells.

10. A solar arrangement according to one of claims 2 or 3, characterized in that a lightguide means is associated with the optically active layer and with each solar cell, and in that the solar cell is disposed at an end of the light guide means.

11. A solar arrangement according to claim 10, characterized in that the solar cells are disposed in a row, and in that light impingement areas of the solar cells are disposed at an angle to a light impingement area of the optically active layer.

12. A solar arrangement according to claim 11 characterized in that the angle is 90°.

13. A solar arrangement according to claim 11, characterized in that the layer of gelatinous material is fashioned so that illumination intensity is applied differently to surfaces of the individual solar cells.

14. A solar arrangement according to claim 13, characterized in that the illumination intensity applied to the surfaces of the individual solar cells decreases as distance from contact means of the solar arrangement increases.

15. A solar arrangement according to one of claims 2, 3, or 4, characterized in that the optically active layer is fashioned so that illumination intensity is applied differently to surfaces of the individual solar cells.

16. A solar arrangement according to one of claims 2, 3, or 4, characterized in that the solar cells are arranged in spaced solar cell groups, and in that at least one of contact means and bus bar means are disposed in the spaces between the solar cell groups.

17. A solar arrangement according to claim 1, characterized in that the hologram is constructed so that incident solar radiation exits from the layer of gelatinous material always in the same direction independently of a time of day.

* * * * *